US009255840B2

(12) United States Patent  (10) Patent No.: US 9,255,840 B2
Moddel et al.  (45) Date of Patent: Feb. 9, 2016

(54) SPECTRUM SPLITTING USING OPTICAL RECTENNAS

(71) Applicant: THE REGENTS OF THE UNIVERSITY OF COLORADO, a body corporate, Denver, CO (US)

(72) Inventors: Garret Moddel, Boulder, CO (US); Saumil Joshi, Dehli (IN)

(73) Assignee: THE REGENTS OF THE UNIVERSITY OF COLORADO, A BODY CORPORATE, Denver, CO (US)

( * ) Notice: Subject to any disclaimer, the term of this patent is extended or adjusted under 35 U.S.C. 154(b) by 196 days.

(21) Appl. No.: 14/063,728

(22) Filed: Oct. 25, 2013

(65) Prior Publication Data

US 2014/0209788 A1    Jul. 31, 2014

Related U.S. Application Data

(60) Provisional application No. 61/718,578, filed on Oct. 25, 2012.

(51) Int. Cl.
   *G01J 3/02*   (2006.01)
   *H01L 27/02*  (2006.01)
   *G01J 3/28*   (2006.01)
   *G01J 1/44*   (2006.01)
   *G01J 5/08*   (2006.01)

(52) U.S. Cl.
   CPC .............. *G01J 3/0205* (2013.01); *G01J 3/2803* (2013.01); *H01L 27/0262* (2013.01); *G01J 1/44* (2013.01); *G01J 5/0837* (2013.01); *H01L 2924/13034* (2013.01)

(58) Field of Classification Search
   CPC combination set(s) only.
   See application file for complete search history.

(56) References Cited

U.S. PATENT DOCUMENTS

2007/0170505 A1*  7/2007  Tokunaga ..................... 257/347
2008/0268796 A1* 10/2008  Fukuda et al. ............. 455/127.1

OTHER PUBLICATIONS

Tien et al, "Multiphoton Process Observed in the Interaction of Microwave Fields with the Tunneling between Superconductor Films", Physical Review, Jan. 15, 1963, vol. 129, No. 2, pp. 647-651.
Corkish, et al., "Solar Collection by Antennas", Solar Energy, Jan. 29, 2003, vol. 73, No. 6, pp. 395-401.
Grover, et al., "Applicability of Metal/Insulator/Metal (MIM) Diodes to Solar Rectennas", Jul. 2011, vol. 1, No. 1, pp. 78-83.
Alda , et al.,"Optical antennas for nano-photonic applications", Nanotechnology, Mar. 4, 2005, vol. 16, pp. S230-S234.
Agarwal, et al, "Coherence Properties of Sunlight", Optics Letters, Mar. 1, 2004, vol. 29, No. 5, pp. 459-461.

(Continued)

*Primary Examiner* — Francis M Legasse, Jr.
(74) *Attorney, Agent, or Firm* — Marsh Fischmann & Breyfogle LLP; Daniel J. Sherwinter

(57) ABSTRACT

Systems and methods for an improved solar/infrared conversion efficiency using multiple rectennas, one for each band of the spectrum. Each rectenna is optimally efficient for each spectrum band. An antenna receives at least one of a visible or infrared spectrum. Rectifying circuits coupled to the antenna generate a current based on a portion of the spectrum received by the at least one antenna. Each rectenna operates efficiently using a different operating voltage. The operating voltages are based on the selected load resistor and the current-voltage characteristics for the diode of the rectifying circuit at the associated spectrum portion.

17 Claims, 6 Drawing Sheets

(56) References Cited

OTHER PUBLICATIONS

Tucker, John R., "Quantam detection at millimeter wavelengths", Reviews of Modern Physics, Oct. 1985, vol. 57, No. 4, pp. 1055-1114.
Mashaal, et al., "Fundamental bounds for antenna harvesting of sunlight", Optics Letters, Mar. 15, 2011, vol. 36, No. 6, pp. 900-902.
Grover, Sachit "Diodes for Optical Rectennas", Thesis submitted to the Faculty of the Graduate School of the University of Colorado, 2011.
Withington, et al., "Multitone quantum simulations of saturating tunnel junction mixers", Journal of Applied Physics, Jun. 15, 2003, vol. 93, No. 2, pp. 9812-9819.
Werthamer, N.R., "Nonlinear Self-Coupling of Josephson Radiation in Superconducting Tunnel Junctions", Physical Review, Jul. 8, 1966, vol. 147, No. 1, pp. 255-263.
Vandenbosch, et al., "Upper bounds for the solar energy harvesting efficiency of nano-antennas", Nano Energy, Mar. 13, 2012, vol. 1, pp. 494-502.
Tucker, John R., "Quantum Limited Detection in Tunnel Junction Mixers", IEEE Journal of Quantum Electronics, Nov. 11, 1979, vol. QE-15, No. 11, pp. 1234-1258.
Shockley, et al., "Detailed Balance Limit of Efficiency of pn Junction Solar Cells", Mar. 1961, Journal of Applied Physics, Mar. 1961, vol. 32, No. 3, pp. 510-519.
Markvart, Tom, "Themodynamics of losses in photovoltaic conversion", 2007, vol. 91, Issue No. 064102.
Hamilton, et al., "rf-Induced Effects in Superconducting Tunnel Junctions", Dec. 1, 1970, vol. 2, No. 1, pp. 4494-4505.
Grover et al., "Engineering the current-voltage characteristics of metal-insulator-metal diodes using double-insulator tunnel barriers", Solid-State Electronics, 2012, vol. 67, pp. 94-99.
Dayhem, et al., "Quantum Interaction of Microwave Radiation with Tunneling Between Superconductors", Physical Review Letters, Mar. 15, 1962, vol. 8, No. 6, pp. 246-249.
Berland, B. "Photovoltaic Technologies Beyond the Horizon: Optical Rectenna Solar Cell" Subcontractor Report, Feb. 2003, NREL/SR-520-33263.

\* cited by examiner

SPECTRUM SPLITTING USING OPTICAL RECTENNAS

PRIORITY CLAIM

This application claims the benefit of U.S. Provisional Application Ser. No. 61/758,578 filed Oct. 25, 2012.

FIELD

Embodiments relate generally to rectennas (i.e., antenna-coupled diodes), and, more particularly, to more efficient rectenna solar cells.

BACKGROUND

It has been assumed implicitly by researchers in the field of rectennas (i.e., antenna-coupled diodes) that rectenna solar cells can provide efficient power conversion for the full solar spectrum. This would appear to be the case because rectennas operating in the microwave band can efficiently convert a broad range of frequencies. However, in the visible and near-infrared spectrums this is not the case.

Ordinarily diodes (as used in rectennas) act as mixers, producing sum and difference frequencies in response to input frequencies. This mixing effect would be expected to homogenize the input frequencies so that a single operating voltage would suffice for power conversion. This mixing effect increases with increasing input power. However, the maximum solar power that can be obtained by each rectenna element is approximately 0.3 microwatts due to coherence limitations. This does not provide sufficient power to produce significant mixing in the diode.

At the frequencies of visible and infrared light, the operation of an optical rectenna is fundamentally quantum mechanical in nature. A monochromatic (single-frequency) light source can, in principle, be converted to electrical power by an optical rectenna with 100% efficiency. However, this high conversion efficiency is available only at one operating voltage, corresponding to the photon energy (in eV) divided by the electronic charge q. That means that the entire solar spectrum cannot be efficiently converted to electrical power using optical rectennas operating at any single voltage.

BRIEF SUMMARY

The present invention provides an improved solar/infrared conversion efficiency using multiple rectennas, one for each band of the spectrum. Each rectenna is optimally efficient for each spectral band.

According to one set of embodiments, a method is provided. The method includes receiving a visible or infrared spectrum at an antenna of a rectenna. A rectifying circuit (diode, filter, load) is coupled to each antenna. At the rectifying circuit coupled to the antenna, a current is generated based on a portion of the spectrum received by the antenna. Each of the rectennas operates efficiently using a different operating voltage. The selected operating voltages are based on the selected load resistor and the current-voltage characteristics for the diode of the rectenna at the previously identified spectral portion. The efficiency of rectifying multiple narrow spectral portions is high compared to the rectification of the entire spectrum.

According to another set of embodiments, a system is provided. The system includes at least one antenna that receives at least one of a visible or infrared spectrum and at least one rectifying circuit that is coupled to the at least one antenna. The rectifying circuits generate a current based on a portion of the spectrum received by the at least one antenna. Each rectifying circuit operates at a different operating voltage.

In one aspect of the invention, the rectennas include a diode and a load resistor coupled in parallel to the antenna.

In another aspect of the invention, the load resistor is a variable load resistor.

In still another aspect of the invention, the system includes a spectral splitting device that splits the received spectrum into at least two spectral bands. The rectennas are located on a single substrate configured to receive the split spectrum bands.

In yet another aspect of the invention, at least one of the rectennas is located on a first substrate that allows at least a portion of the spectrum to pass through. Another of the rectennas is located on a second substrate. The second substrate is located further from the source of the spectrum.

In a further aspect of the invention, the antenna comprises at least one dipole antenna or bowtie antenna or any frequency selective surface.

BRIEF DESCRIPTION OF THE DRAWINGS

The present disclosure is described in conjunction with the appended figures.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION

Ordinarily a diode rectifier in a rectenna would not require different operating voltages for different frequencies. However, quantum rectification (i.e., photon-assisted tunneling) that takes place for visible and near-infrared photons requires photon-energy-dependent (or similarly wavelength-dependent) operating voltages.

In order to take advantage of the photon-energy-dependent voltage, the present invention passively or actively splits the solar spectrum into different spectral bands, each of which is absorbed by rectennas having an operating voltage that optimizes the power conversion efficiency for that band.

Figure 1:
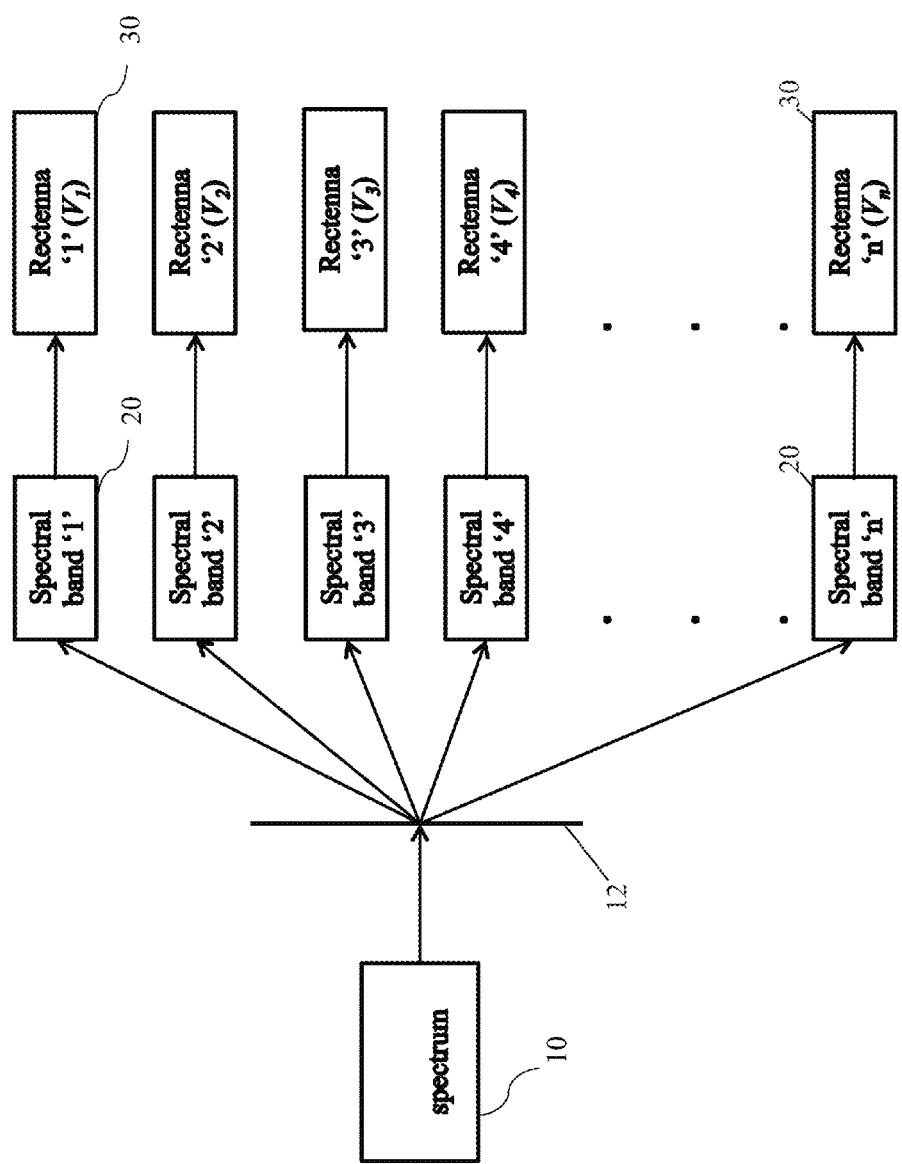
FIG. 1 shows a schematic diagram of an exemplary portion of a spectral splitting rectenna system.

As shown in FIG. 1, a radiation source (e.g., the sun, or any source of thermal radiation like a hot body) provides radiation 10 (visible/infrared) that is split by a spectral splitting device 12 into previously defined spectral frequency bands 20. The previously defined spectral frequency bands 20 are directed by the spectral splitting device 12 to rectennas 30 having customized operating voltages. The operating voltage is determined by selecting the resistance of the load for a given input power. The given input power is determined by the received spectral band. Each rectenna 30 is designed to absorb radiation over a well defined spectral band corresponding to the operating voltage for that rectenna.

Figure 2:
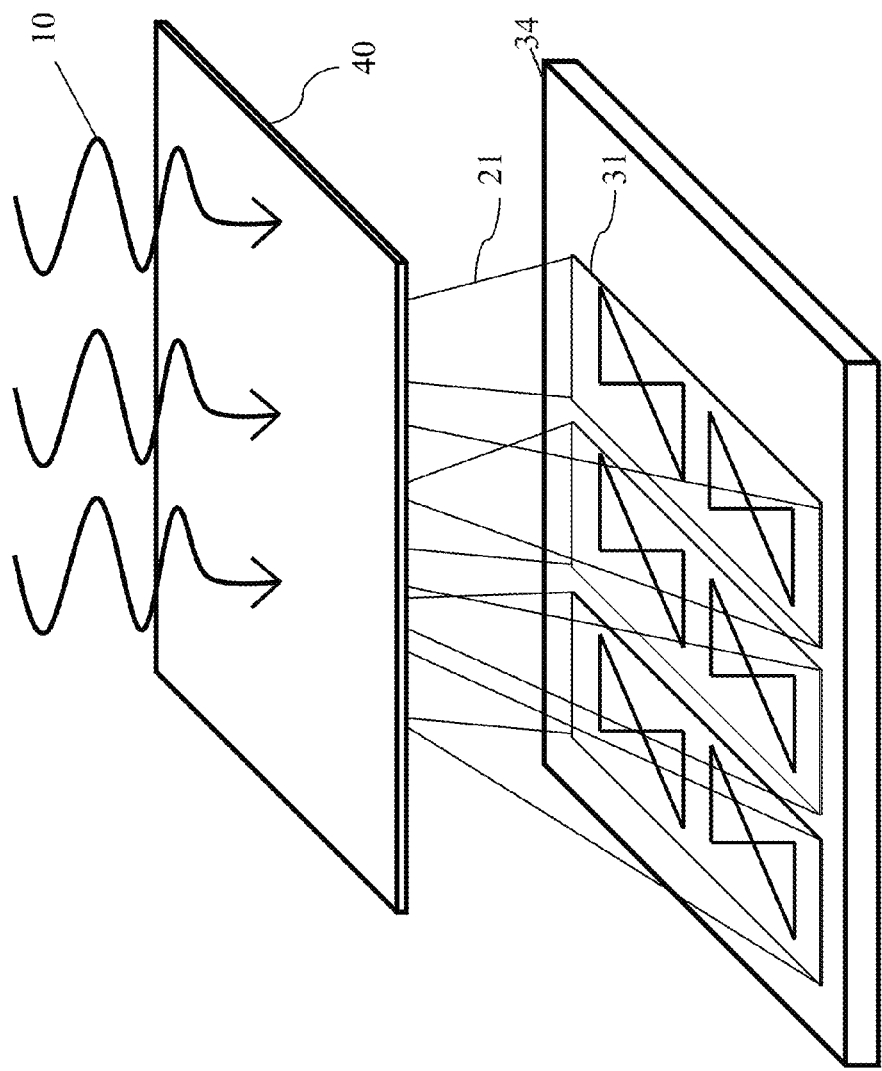
FIG. 2 shows a perspective view of a portion of a planar spectral splitting rectenna system.

In one embodiment as shown in FIG. 2, splitting of the spectrum 10 is accomplished optically, using a wavelength-selective device 40. A prism or a grating will suitably spatially split the spectrum into spectral components. The wavelength-selective device 40 sends spectral bands 21 to a group of frequency-insensitive rectennas 31 located on a substrate 34 (e.g., printed circuit board). The rectennas 31 are coplanar, with different spectral bands 21 being processed by spatially separated rectennas. In one embodiment, the antennas used in the rectennas 31 include broadband bowtie antennas.

Figure 3:
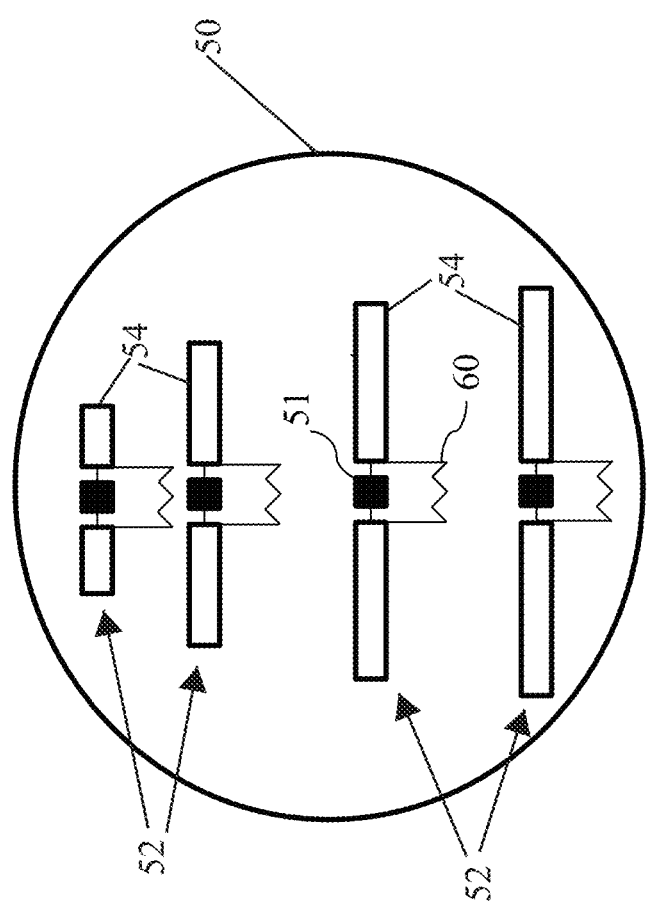
FIG. 3 shows a top view of a portion of a planar spectral splitting rectenna system.

As shown in FIG. 3, a substrate 50 includes frequency-sensitive rectennas 52 that absorb only a predefined band of wavelengths. Thus, the spectral splitting is done passively. The frequency-sensitive rectennas 52 include wavelength-selective dipole antennas 54. The spectrum is incident on the surface of the substrate 50. The frequency-sensitive rectennas 52 include a diode 51 and a load resistor 60. The diodes 51 and the load resistor 60 are configured to operate at a particular operating voltage. An example diode 51 includes a metal insulator metal (MIM) diode.

Because the dipole antennas 54 can absorb radiation over an area that is larger than their physical size, the dipole antennas 54 that are sensitive to different spectral bands are arrayed over the substrate surface 50. Different spectral portions of the total radiation (incident over the large area) are absorbed by the selective antennas occupying no more footprint than the area occupied by the incident radiation. As a result, spectral splitting is achieved by spatially separated rectennas on the same plane and does not require a grating.

Figure 4:
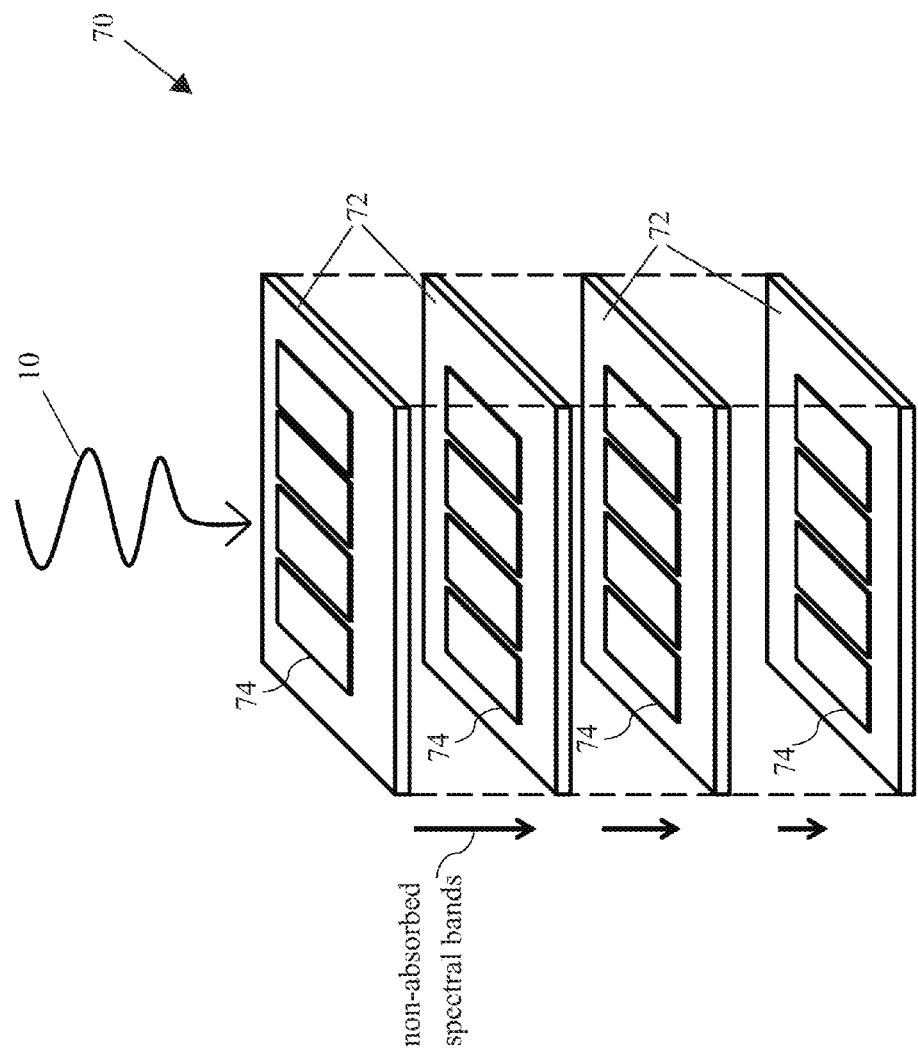
FIG. 4 shows a perspective view an exemplary multi-planar spectral splitting rectenna.

As shown in FIG. 4, a rectenna system 70 includes stacks of semi-permeable substrates 72 that include one or more frequency-sensitive rectenna 74. Each level of the stack of rectennas absorbs different frequency bands. Thus, non-absorbed frequency bands penetrate to the next substrate layer 72. The material chosen depends on the incident spectrum (visible, NIR, long wavelength IR). Examples include quartz, fused silica, transparent polymers/plastics, calcium fluoride and potassium bromide IR transparent substrates.

In another embodiment, a single broadband antenna absorbs the entire spectrum of interest, or a substantial fraction of it. The electric current coming from the antenna is split into frequency bands, and each frequency band of current is directed to a separate diode whose operating voltage is tuned for that band. One way to accomplish the splitting is with the use of passive inductor-capacitor (LC) filters, as is conventionally used to filter ac signals.

Figure 5:
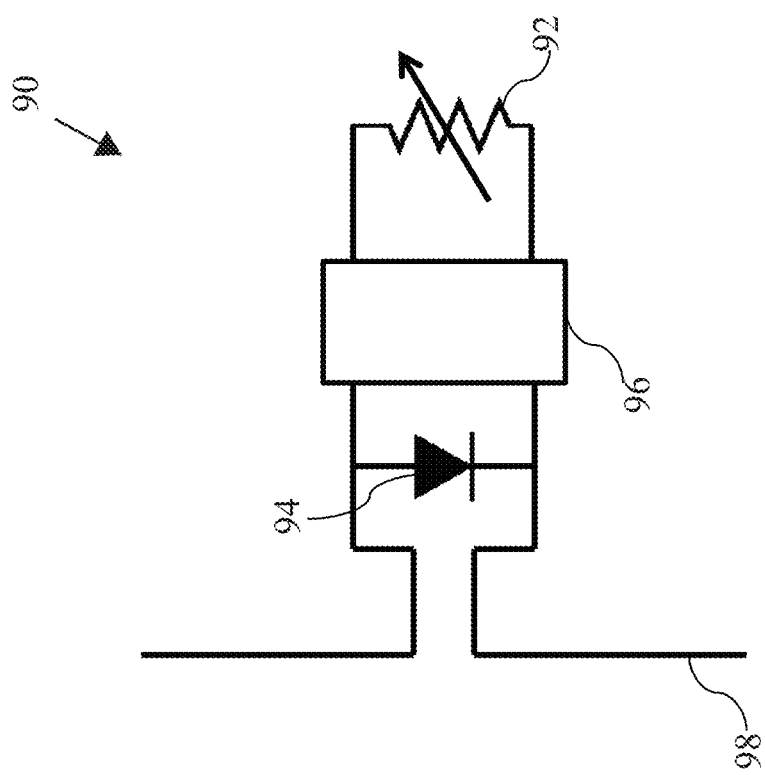
FIG. 5 shows an exemplary circuit diagram of a single rectenna.

FIG. 5 shows an exemplary rectenna circuit 90. The rectenna circuit 90 includes an adjustable load resistor 92, an antenna (frequency sensitive or insensitive) 98, a diode 94 and a DC output filter 96. The DC output filter 96 blocks AC power dissipation in the load resistor 92. The adjustable load resistor 92 is adjusted to provide a desired voltage across the diode 94.

Figure 6:
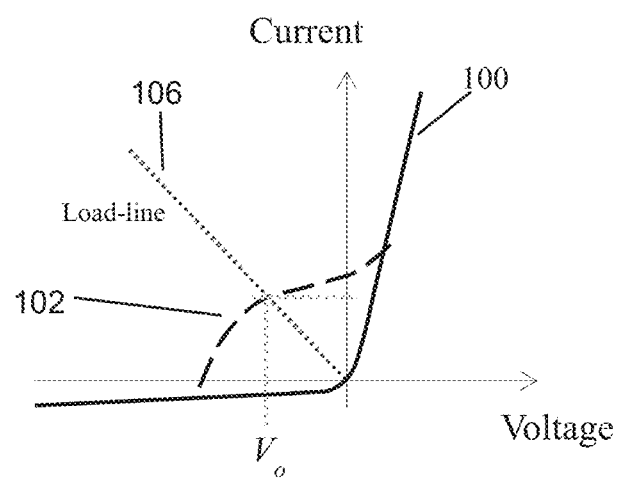
FIG. 6 shows a graph of current-voltage characteristics for an exemplary rectenna diode.

FIG. 6 shows current-voltage [I(V)] characteristics for a rectenna diode (such as the diode 94). The solid curve 100 is the I(V) for an exemplary rectenna in the dark (i.e., not exposed to the spectral source), and the dashed curve 102 shows the I(V) under illumination from a specific spectral band. The voltage at which the dashed curve 102 crosses the Voltage axis is equal to the photon energy divided by the electron charge. The location where the curve 102 crosses the v-axis indicates the maximum voltage that the rectenna can extract from the incident spectrum. Beyond this voltage, the current is negative and the rectenna cannot generate any energy. For an ideal rectenna diode illuminated by a monochromatic source, the rectenna efficiency approaches 100% when the bias voltage is equal to the photon energy divided by the electron charge. Therefore, for a high-photon-energy slice (band) of the spectrum the dashed line 102 extends farther to the left on the Voltage axis than for a low-photon-energy slice. A load-line 106 intersects the rectenna illuminated I(V) (the dashed curve 102) at the operating voltage $V_o$. Rectenna output power is the area under the dashed curve 102 at the load-line 106 intersection. The slope of the load-line 106 and hence the operating voltage can be chosen for high rectenna efficiency by tuning the load impedance. The illuminated I(V) curve (dashed curve in FIG. 6) is a function of the power and the energies of the different photons in the incident spectral band.

All the different spectral bands (i.e., frequencies) can be absorbed using rectennas composed of the same materials. The spectral sensitivity is determined by the operating voltage, and can also be affected by the antenna design and size. This provides a great reduction in the cost of making a wide spectral band rectenna system. This is particularly advantageous over spectrum splitting in conventional solar cells, where different materials are required for each spectral region.

For optimum efficiency, the diode I(V) characteristic has to be such that the diode impedance presented to a slice of the spectrum is matched to the antenna impedance. This results in maximum power transfer from the antenna to the diode. Also, the diode must have a fast response time so that its RC time constant is less than the inverse of (2 times π times the maximum frequency in the incident band).

The present invention applies to solar radiation and to any broad optical or infrared spectrum (e.g., near, mid, and long-wave IR spectrum). For example, power conversion from a hot object or source that produces blackbody radiation in the infrared would also benefit from the spectrum-splitting approach that is taught in detail herein.

Other examples and implementations are within the scope and spirit of the disclosure and appended claims. For example, features implementing functions can also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein can be utilized. Accordingly, the appended claims include within their scope such processes, machines, manufacture, compositions of matter, means, methods, or actions.

What is claimed is:

1. A rectenna system comprising:
   a plurality of antennas configured to receive at least one of a visible or infrared spectrum; and
   a plurality of rectifying circuits coupled to the antennas, each rectifying circuit configured to generate a current based on a portion of the spectrum received by the antennas,
   wherein each rectifying circuit has an operating voltage based on a different frequency band of the spectrum received by the antennas.

2. The rectenna system of claim 1, wherein at least one of the rectifying circuits comprises a diode and a load resistor, wherein the diode and the load resistor are coupled in parallel to the at least one antenna.

3. The rectenna system of claim 1, further comprising a spectral splitting device configured to split the received spectrum into at least two spectrum bands.

4. The rectenna system of claim 1, wherein the plurality of rectifying circuits and the coupled antennas defines a plurality of rectennas, wherein the plurality of rectennas are located on a single substrate configured to receive the at least two spectrum bands.

5. The rectenna system of claim 1, wherein the plurality of rectifying circuits and the coupled antennas defines a plurality of rectennas, wherein at least one of the plurality of rectennas is located on a first substrate configured to allow at least a portion of the spectrum to pass through and wherein at least another of the plurality of rectennas is located on a second substrate.

6. The rectenna system of claim 1, wherein the at least one antenna comprises at least one dipole antenna.

7. The rectenna system of claim 1, wherein the at least one antenna comprises at least one bowtie antenna.

8. The rectenna system of claim 2, wherein the load resistor is a variable load resistor.

9. The rectenna system of claim 5, wherein the first substrate and second substrate are located at different distances along an incident path of the received spectrum.

10. A method comprising:
    receiving, with a plurality of antennas, at least one of a visible or infrared spectrum; and
    generating, with each of a plurality of rectifying circuits coupled to a respective at least one of the antennas, a current based on a portion of the spectrum received by the respective at least one of the antennas,
    wherein each rectifying circuit has an operating voltage based on a different frequency band of the spectrum received by the respective at least one of the antennas.

11. The method of claim 10, further comprising optically splitting the received spectrum before being received by the antennas.

12. The method of claim 10, wherein receiving comprising receiving a portion of the received spectrum at the antennas.

13. A rectenna system comprising:
    a plurality of rectennas, each rectenna comprising:
    an antenna configured to receive at least a portion of a visible or infrared spectrum;
    a diode; and
    a load resistor,
    wherein the diode and the load resistor are coupled in parallel to the antenna,
    wherein each of the rectennas has an operating voltage based on a different frequency band of the spectrum.

14. The rectenna system of claim 13, wherein a value for the load resistor of a first one of the rectennas is based on a first frequency band of the received spectrum,
    wherein a value for the load resistor of a second one of the rectennas is based on a second frequency band of the received spectrum.

15. The rectenna system of claim 14, wherein at least one of the rectennas are mounted on each of a plurality of substrates, wherein the substrates are placed in stacked formation relative to an incident angle of the received spectrum portion.

16. The rectenna system of claim 14, wherein each of the rectennas are mounted on a substrate.

17. The rectenna system of claim 16, wherein the antennas are configured to receive different portions of the spectrum.

* * * * *